(12) United States Patent
Fukuda

(10) Patent No.: US 9,622,351 B2
(45) Date of Patent: Apr. 11, 2017

(54) SEMICONDUCTOR MODULE

(71) Applicant: FUJI ELECTRIC CO., LTD., Kanagawa (JP)

(72) Inventor: Kyohei Fukuda, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/059,310

(22) Filed: Mar. 3, 2016

(65) Prior Publication Data

US 2016/0295701 A1    Oct. 6, 2016

(30) Foreign Application Priority Data

Apr. 1, 2015  (JP) .................. 2015-075002

(51) Int. Cl.
*H05K 1/03* (2006.01)
*H05K 7/00* (2006.01)
*H05K 1/18* (2006.01)

(52) U.S. Cl.
CPC .................. *H05K 1/181* (2013.01)

(58) Field of Classification Search
CPC ..................................... H05K 1/181
USPC .......................... 174/255; 361/783
See application file for complete search history.

(56) References Cited

U.S. PATENT DOCUMENTS

| | | | | |
|---|---|---|---|---|
| 5,130,768 A | * | 7/1992 | Wu | H01L 23/4006 257/712 |
| 5,296,735 A | * | 3/1994 | Fukunaga | H01L 23/142 257/659 |
| 5,466,969 A | * | 11/1995 | Tsunoda | H01L 23/18 257/706 |
| 6,504,110 B1 | * | 1/2003 | Kusukawa | H05K 3/22 174/261 |
| 2002/0125563 A1 | | 9/2002 | Scheuermann | |
| 2005/0243531 A1 | * | 11/2005 | Kulpa | H05K 7/1092 361/783 |
| 2012/0261174 A1 | * | 10/2012 | Chuma | C08L 63/00 174/260 |
| 2014/0346676 A1 | * | 11/2014 | Horio | H01L 25/18 257/773 |
| 2015/0223339 A1 | | 8/2015 | Nakamura et al. | |

FOREIGN PATENT DOCUMENTS

| | | |
|---|---|---|
| JP | 2002-270730 A | 9/2002 |
| JP | 2003-289130 A | 10/2003 |
| JP | 2009-64852 A | 3/2009 |
| JP | 2012-9815 A | 1/2012 |
| JP | 2012-234857 A | 11/2012 |
| WO | 2014/061211 A1 | 4/2014 |

* cited by examiner

*Primary Examiner* — Sherman Ng

(57) ABSTRACT

It is aimed to reduce the electrical field intensity at a laminate substrate on which a semiconductor device is placed. A semiconductor module includes a laminate substrate including an insulative plate, a circuit board provided on a first surface of the insulative plate and a metal plate provided on a second surface that is opposite to the first surface, and an interconnecting substrate that is provided so as to oppose the laminate substrate and that includes a metal layer. Here, the insulative plate extends more outside than an outer edge portion of the circuit board, and the metal layer has a region overlapping the outer edge portion of the circuit board and extends more outside than the outer edge portion of the circuit board.

9 Claims, 20 Drawing Sheets

SEMICONDUCTOR MODULE

The contents of the following Japanese patent application are incorporated herein by reference:
NO. 2015-075002 filed on Apr. 1, 2015.

BACKGROUND

1. Technical Field

The present invention relates to a semiconductor module.

2. Related Art

Within a semiconductor module, to which a high voltage may be applied, a semiconductor device is placed on a laminate substrate. The laminate substrate includes an insulative plate made of ceramics or the like, a circuit board disposed on the front surface of the insulative plate, and a metal plate disposed on the back surface of the insulative plate. On the circuit board, the semiconductor device is placed. As a high voltage is applied to the semiconductor device, a high voltage is also applied to the circuit board. In particular, the edge portions of the circuit board are exposed to a higher electrical field intensity than the other portions of the circuit board. In the conventional art, to reduce the electrical field intensity at the edge portions of the circuit board, the interval between the edge portions of the ceramics layer and the edge portions of the circuit board has been made smaller than the interval between the edge portions of the ceramics layer and the edge portions of the metal plate (see, for example, Japanese Patent Application Publication No. 2002-270730).

The present invention employs a novel approach to reduce the electrical field intensity, to a level lower than in the conventional art, at the circuit board on which the semiconductor device is placed in the semiconductor module, to which a high voltage may be applied.

SUMMARY

A first aspect of the innovations may include a semiconductor module including a laminate substrate including an insulative plate, a circuit board provided on a first surface of the insulative plate and a metal plate provided on a second surface that is opposite to the first surface, and an interconnecting substrate that is provided so as to oppose the laminate substrate and that includes a metal layer. Here, the insulative plate extends more outside than an outer edge portion of the circuit board, and the metal layer has a region overlapping the outer edge portion of the circuit board and extends more outside than the outer edge portion of the circuit board.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
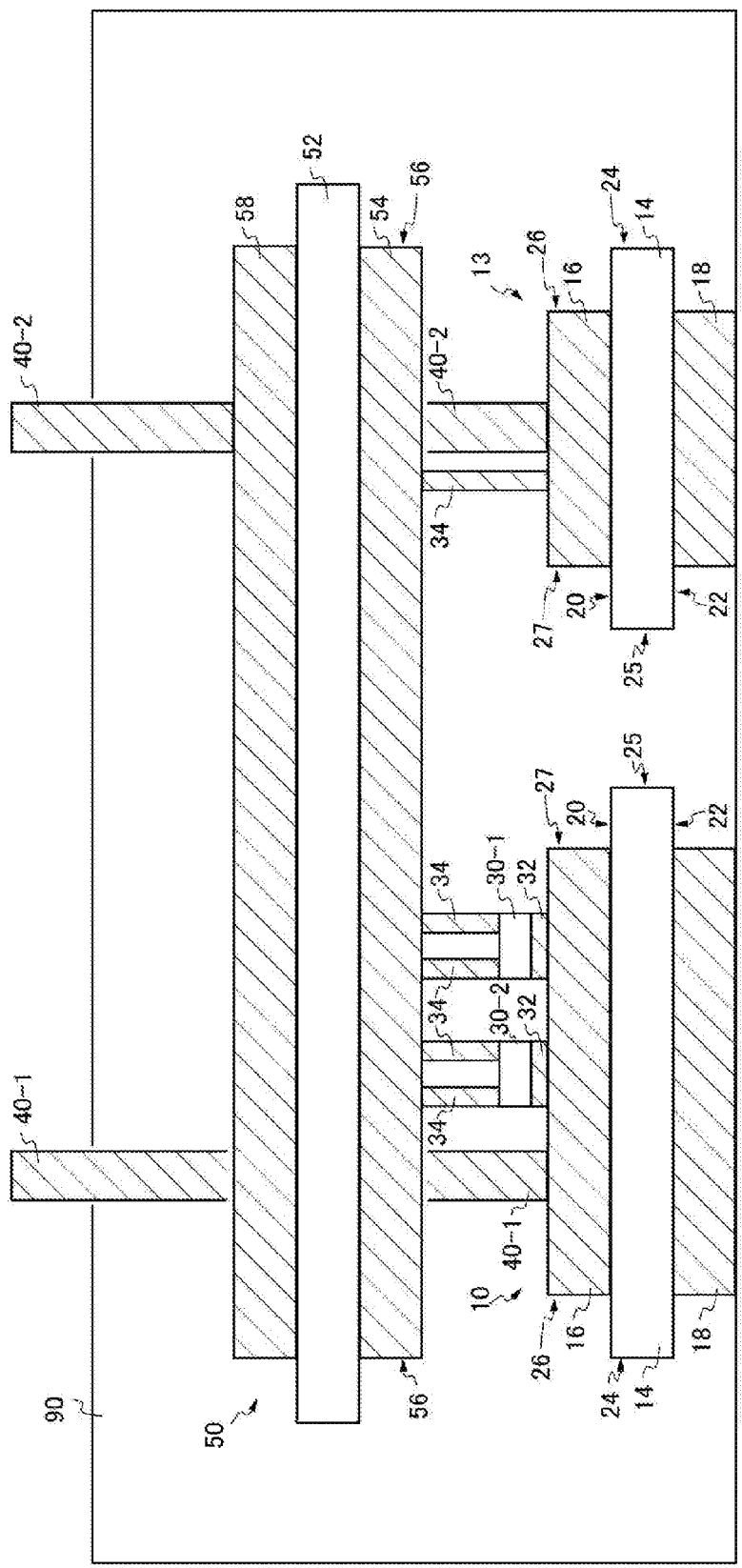
FIG. 1 is a schematic cross-sectional view of a semiconductor module 100 in a first embodiment.

FIG. 1 is a schematic cross-sectional view of a semiconductor module 100 in a first embodiment. The semiconductor module 100 of the present embodiment includes a laminate substrate 10, a laminate substrate 13, and an interconnecting substrate 50 that is provided to oppose the laminate substrate 10 and the laminate substrate 13. The semiconductor module 100 includes a resin 90 to seal the laminate substrates 10 and 13 and the interconnecting substrate 50 therein. The resin 90 is, for example, an epoxy-based resin.

The laminate substrate 10 includes an insulative plate 14, a circuit board 16, and a metal plate 18. The insulative plate 14 is formed like a flat plate, and has a first surface 20, which is the main surface, and a second surface 22, which is opposite to the first surface 20. The circuit board 16 is provided on the first surface 20 of the insulative plate 14, and the metal plate 18 is provided on the second surface 22. The circuit board 16 and the metal plate 18 are made of, for example, copper (Cu) or aluminum (Al).

The insulative plate 14 is made of, for example, a sintered product of a silicon nitride ($SiN_x$), aluminum nitride ($AlN_x$) or aluminum oxide ($Al_2O_3$). An outer edge portion 24 of the insulative plate 14 is positioned more outside than an outer edge portion 26 of the circuit board 16. Here, note that, as used herein, the phrase "an outer edge portion" denotes the edge portion of a component that is positioned closer to the outer peripheral of the semiconductor module 100 than the remaining portion of the component.

In the present embodiment, the laminate substrates 10 and 13 respectively have separate insulative plates 14. In other words, the insulative plate 14 for the laminate substrate 10 is separated away from the insulative plate 14 for the laminate substrate 13. It should be noted that the laminate substrates 10 and 13 may not have separate insulative plates 14. In other words, the laminate substrates 10 and 13 may share a common insulative plate 14. In this case, an opening may be provided at the boundary between the laminate substrate 10 and the laminate substrate 13.

The circuit board 16 is a metal layer having circuit patterns therein. The circuit patterns in the circuit board 16 are designed to electrically connect a plurality of external terminals 40, a plurality of electrically conductive adhesive layers 32 and a plurality of electrically conductive posts 34.

The metal plate 18 has rectangular front and back surfaces. The front surface of the metal plate 18 is in contact with the second surface 22 of the insulative plate 14. The back surface of the metal plate 18 is not covered with the resin 90 and externally exposed to the outside of the semiconductor module 100. The metal plate 18 is configured to release the heat generated from a semiconductor device 30 to the outside of the semiconductor module 100.

The circuit board 16 has a plurality of semiconductor devices 30 placed thereon with a plurality of electrically conductive adhesive layers 32 provided therebetween. The plurality of semiconductor devices 30 include a first semiconductor device 30-1 having a switching capability and a second semiconductor device 30-2 having a rectifying capability.

The first semiconductor device 30-1 is, for example, an insulated gate bipolar transistor (IGBT) or a power metal oxide semiconductor field effect transistor (MOSFET). Here, an IGBT and a power MOSFET are formed in a substrate made of silicon (Si), silicon carbide (SiC) or gallium nitride (GaN). The first semiconductor device 30-1 is, for example, a power MOSFET formed in a SiC substrate.

The second semiconductor device 30-2 is a diode and a PN diode or Schottky barrier diode (SBD), for example. In the present embodiment, the second semiconductor device 30-2 is a SBD.

The laminate substrate 10 has a plurality of semiconductor devices 30 placed thereon. The plurality of semiconductor devices 30 each have an electrode (for example, a drain or cathode electrode) on the back surface thereof, which is electrically connected to an external terminal 40-1 via the circuit board 16. In addition, the plurality of semiconductor devices 30 each have another electrode (for example, a source, gate or anode electrode) on the front surface thereof, which is electrically connected to the interconnecting substrate 50 via the plurality of electrically conductive posts 34.

The laminate substrate 13 has no semiconductor devices 30 placed thereon. The circuit board 16 of the laminate substrate 13 provides interconnections within the semiconductor module 100. In the present embodiment, the circuit board 16 of the laminate substrate 13 provides source interconnections, for example. The circuit board 16 of the laminate substrate 13 is electrically connected to a metal layer 54 via the plurality of electrically conductive posts 34. In addition, the circuit board 16 of the laminate substrate 13 is electrically connected to an external terminal 40-2.

The external terminals 40 extend outside through the resin 90. The external terminals 40 pass through the holes provided in the interconnecting substrate 50. The external terminals 40 are not electrically connected to the interconnecting substrate 50. In other words, the external terminals 40 are electrically connected neither to the metal layer 54 nor to the metal layer 58 in the interconnecting substrate 50.

When the semiconductor module 100 is supplied with currents (in the ON state), the external terminal 40-1 connected to the circuit board 16 of the laminate substrate 10 serves as the drain terminal of the semiconductor module 100. On the other hand, the external terminal 40-2 connected to the circuit board 16 of the laminate substrate 13 serves as the source terminal of the semiconductor module 100. Thus, while the semiconductor module 100 is operative, the external terminal 40-1 is applied with a higher voltage than the external terminal 40-2.

When the semiconductor module 100 is supplied with currents (in the ON state), currents flow between the plurality of external terminals 40. For example, currents flow through the external terminal 40-1, the circuit board 16 of the laminate substrate 10, the electrically conductive adhesive layers 32, the semiconductor devices 30, the electrically conductive posts 34 on the laminate substrate 10, the metal layer 54 of the interconnecting substrate 50, the electrically conductive posts 34 on the laminate substrate 13, the circuit board 16 of the laminate substrate 13, and the external terminal 40-2 in the stated order. Note that the metal plate 18 always has a low potential even while the semiconductor module 100 is supplied with currents. In the present embodiment, the metal plate 18 has a ground potential (0V).

The interconnecting substrate 50 is a printed board, for example. In the present embodiment, the interconnecting substrate 50 has a base portion 52, the metal layer 54 and the metal layer 58. The metal layer 54 is provided on the surface of the base portion 52 that faces the laminate substrates 10 and 13. Additionally, the metal layer 58 is provided on the surface of the base portion 52 which faces away from the metal layer 54. The interconnecting substrate 50 has a plurality of holes through which the external terminals 40 pass. The metal layers 54 and 58 may have a plurality of holes to allow the external terminals 40 to pass therethrough or may be provided so as not to block the plurality of holes.

The base portion 52 is insulative. The metal layers 54 and 58 are metal layers having circuit patterns therein. The metal layer 54 provides the source interconnections within the semiconductor module 100 and is connected to the circuit board 16 of the laminate substrate 13 via the electrically conductive posts 34. The metal layer 58 provides the gate interconnections within the semiconductor module 100 and connected to an external terminal 40 for a gate (not shown). The metal layer 54 is also connected to the source electrode on the front surface of the first semiconductor device 30-1 and the anode electrode on the front surface of the second semiconductor device 30-2 via the electrically conductive posts 34. In addition, the metal layer 58 is connected to the gate electrode on the front surface of the first semiconductor device 30-1 via the electrically conductive posts 34.

As shown in FIG. 1, in the present embodiment, the metal layer 54 has a region overlapping the outer edge portion 26 of the circuit board 16 and extends more outwardly than the outer edge portion 26 of the circuit board 16.

According to the circuit board 16 and the metal layer 54 of the present embodiment, the equipotential lines between the outer edge portion 24 of the insulative plate 14 and the outer edge portion 26 of the circuit board 16 are less dense than in the conventional art. As a result, the electrical field intensity at the outer edge portion 26 of the circuit board 16 can be reduced.

In addition, in the present embodiment, the laminate substrates 10 and 13 respectively have separate metal plates 18. In this way, the equipotential lines between the inner edge portion 25 of the insulative plate 14 and the inner edge portion 27 of the circuit board 16 are less dense than when the laminate substrates 10 and 13 share a common metal plate 18. As a result, the electrical field intensity at the inner edge portion 27 of the circuit board 16 can be reduced.

Figure 2A:
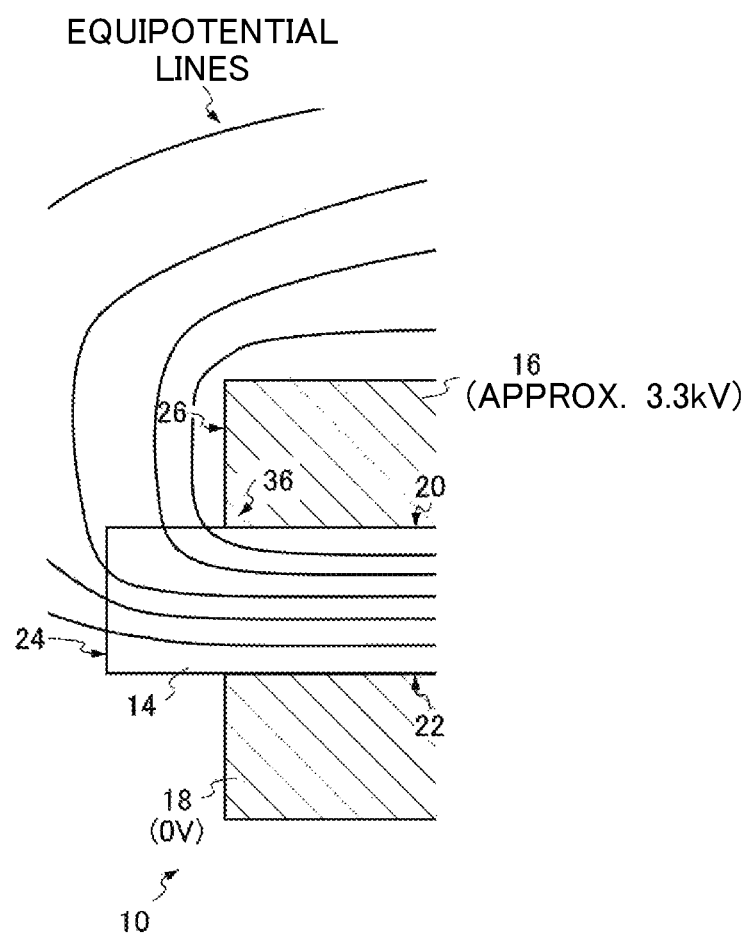
FIGS. 2A to 2C illustrate the principle of reducing the electrical field intensity in the first embodiment.
Figure 2B:
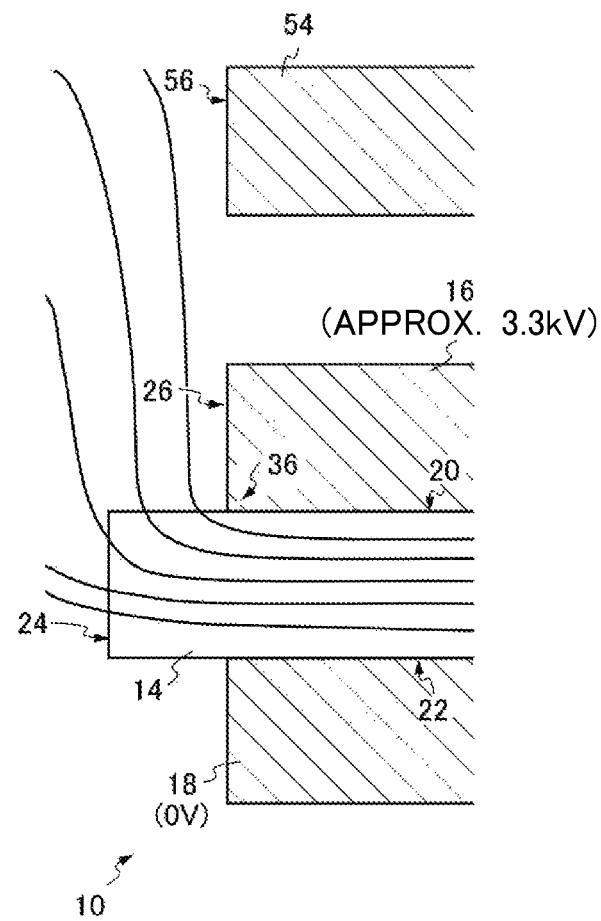
Figure 2C:
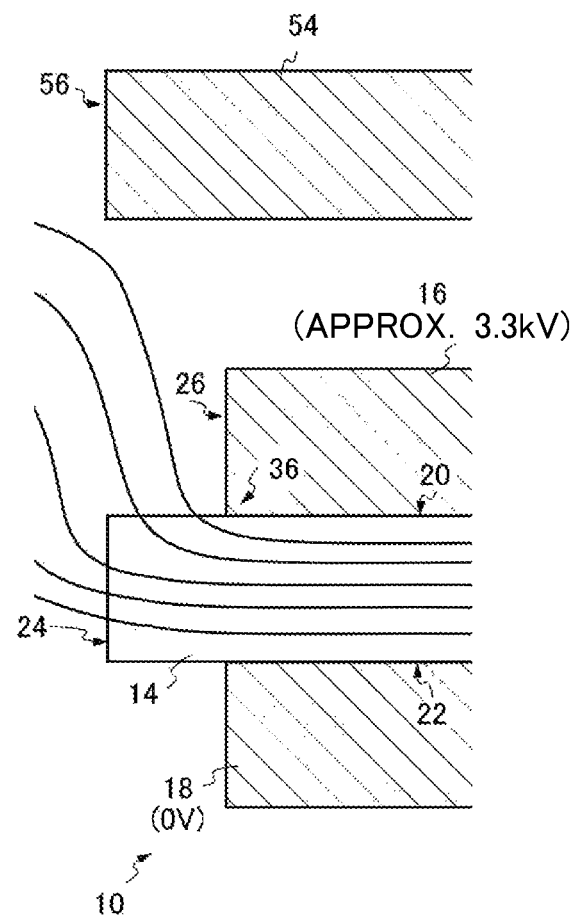

FIGS. 2A to 2C illustrate the principle of reducing the electrical field intensity in the first embodiment. FIGS. 2A to 2C are partially enlarged views of the outer edge portion 26 of the circuit board 16 of the laminate substrate 10 of FIG. 1. Note that the equipotential lines shown in FIGS. 2A to 2C are only presented to give a general idea of the actual equipotential lines.

FIG. 2A shows the equipotential lines observed when the interconnecting substrate 50 is not provided in the first embodiment. FIG. 2B shows the equipotential lines observed when the interconnecting substrate 50 is provided and the outer edge portion 56 of the metal layer 54 of the interconnecting substrate 50 is positioned so as to match the outer edge portion 26 of the circuit board 16 in the first embodiment. FIG. 2C shows the equipotential lines observed when the first embodiment is implemented as described above.

The circuit board 16 of the laminate substrate 10 is applied with a high voltage both when the semiconductor module 100 is supplied with currents (in the ON state) and when the semiconductor module 100 is not supplied with currents (in the OFF state). In the present embodiment, it is assumed that the circuit board 16 is applied with a voltage of approximately 3.3 kV. Here, the letter "k" means the cube of 10. On the other hand, the metal plate 18 is grounded and the potential of the metal plate 18 is thus 0 V. Note that the circuit board 16 has an equal potential across the entire metal layer. Likewise, the metal plate 18 also has an equal potential across the entire metal layer.

In the insulative plate 14, the potential varies in a continuous manner from approximately 3.3 kV at the first surface 20 to 0 V at the second surface 22. In the present embodiment, 5 equipotential lines are schematically shown between 3.3 kV and 0 V at intervals of 550 V.

As seen from FIG. 2A, when the interconnecting substrate 50 is not provided, the equipotential lines surround the outer edge portion 26 of the circuit board 16. The equipotential lines extending outwards between the outer edge portion 26 of the circuit board 16 and the outer edge portion 24 of the insulative plate 14 sharply rise in a substantially parallel direction to the outer edge portion 26. The sharply rising equipotential lines wraps around the circuit board 16 to appear at the front surface of the circuit board 16.

The electrical field intensity increases as the intervals between the adjacent equipotential lines decrease. As seen from FIG. 2A, the equipotential lines are most dense at the lower corner portion 36 of the outer edge portion 26 of the circuit board 16. Therefore, the electrical field intensity is locally high at the corner portion 36 of the circuit board 16.

As the electrical field intensity of the corner portion 36 of the circuit board 16 increases, partial discharge may occur from the corner portion 36. The partial discharge from the corner portion 36 may degrade the insulative plate 14, which is in contact with the corner portion 36. As a result, breakdown of the insulative plate 14 may occur. If this occurs, the semiconductor module 100 no longer perform pre-designed functions. Accordingly, it is important to assuredly maintain the insulative properties of the insulative plate 14. To assuredly maintain the insulative properties of the insulative plate 14, it is important to reduce the electrical field intensity at the corner portion 36 of the circuit board 16.

In the case shown in FIG. 2B, the electrical field intensity at the corner portion 36 is reduced when compared with the case shown in FIG. 2A since the equipotential lines are prevented from wrapping around the circuit board 16 to appear at the front surface of the circuit board 16. Like the case shown in FIG. 2A, however, the equipotential lines rise in a substantially parallel direction to the outer edge portion 26 in the case shown in FIG. 2B. Therefore, the concentration of the electrical fields at the corner portion 36 cannot be completely alleviated.

On the other hand, as seen from FIG. 2C, when the outer edge portion 56 of the metal layer 54 is positioned more outside than the outer edge portion 26 of the circuit board 16, the equipotential lines avoid the metal layer 54 and are driven outwards. In this manner, the electrical field intensity at the corner portion 36 of the circuit board 16 is further reduced when compared with the case shown in FIG. 2B and the partial discharge from the corner portion 36 can be prevented. Note that the electrical field intensity can be also reduced in a similar manner at the corner portion of the inner edge portion 27 of the circuit board 16. It should be understood that "a inner edge portion," as used herein, denotes the edge portion of the laminate substrates 10 and 13 that is positioned more inside of the semiconductor module 100 than the remaining portion of the laminate substrates 10 and 13.

Figure 3:
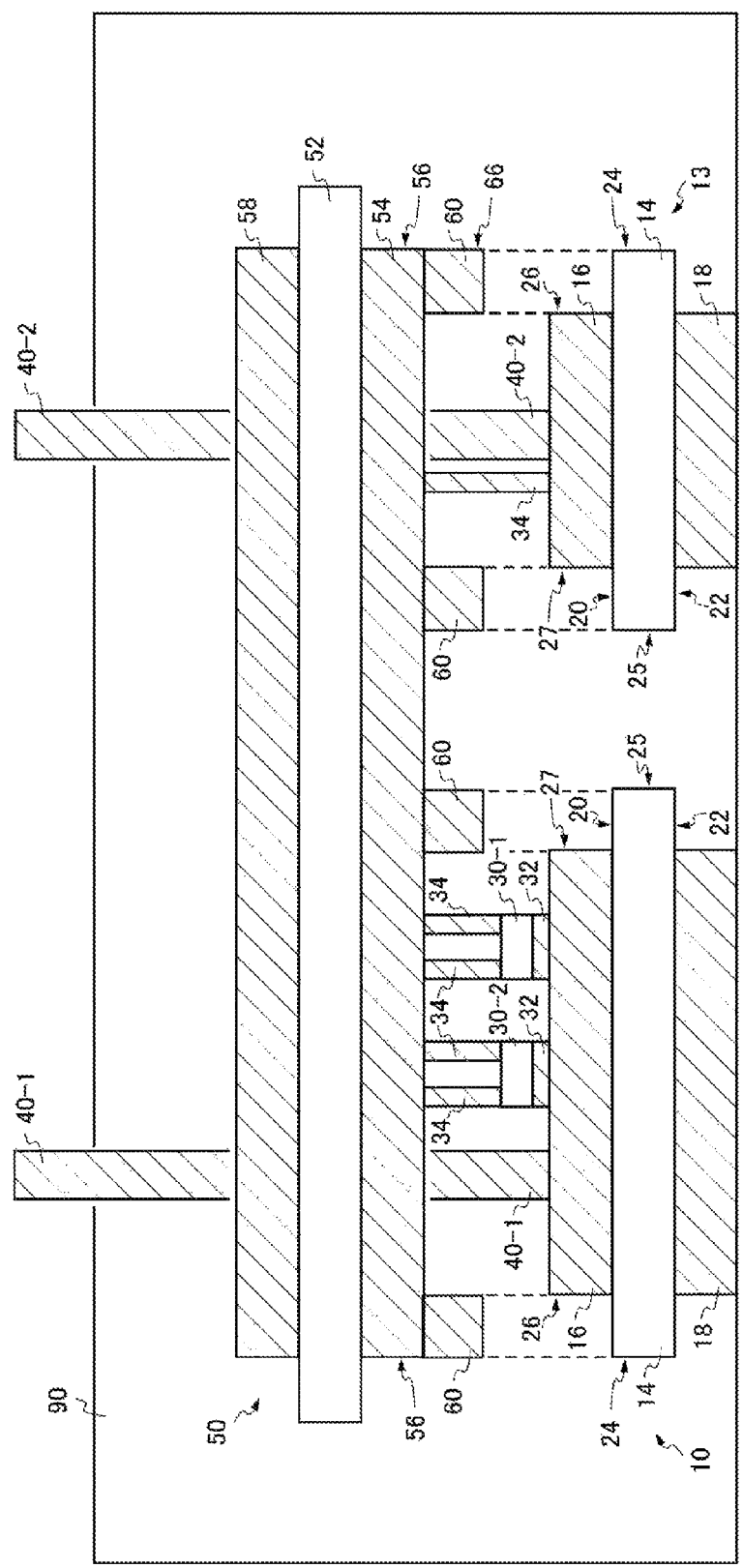
FIG. 3 is a schematic cross-sectional view of a semiconductor module 110 in a second embodiment.

FIG. 3 is a schematic cross-sectional view of a semiconductor module 110 in a second embodiment. The semiconductor module 110 of the present embodiment has at least one metal protrusion 60 in the interconnecting substrate 50. In this respect, the second embodiment is different from the first embodiment. Except this, the second embodiment is the same as the first embodiment.

The metal protrusion 60 protrudes from the metal layer 54 towards the laminate substrate 10. At least a portion of the metal protrusion 60 is positioned more outside than the outer edge portion 26 of the circuit board 16. The interconnecting substrate 50 may have a plurality of metal protrusions 60.

The metal protrusion 60 may have an area overlapping the outer edge portion 26 of the circuit board 16. When seen in the direction perpendicular to the plane of the insulative plate 14, the outer edge portion 66 of the metal protrusion 60 may be positioned so as to match the position of the outer edge portion 24 of the insulative plate 14. This may be indicated by the dotted lines in FIG. 3. For example, the metal layer 54 and the metal protrusion 60 can be formed as a single piece by bending the outmost portion of the metal layer 54.

As shown in FIG. 3, additional metal protrusions 60 may be provided more inside than the inner edge portion 27 of the circuit board 16. In other words, the additional metal protrusions 60 may be provided more inside than the circuit board 16. In this way, the electrical field intensity at the corner portion of the inner edge portion 27 of the circuit board 16 is reduced.

In the semiconductor module 110 of the present embodiment, the circuit board 16 of the laminate substrate 10 and the circuit board 16 of the laminate substrate 13 are separated away from each other and applied with different voltages in operation. Specifically speaking, the voltage applied to the circuit board 16 of the laminate substrate 10 is higher than the voltage applied to the circuit board 16 of the laminate board 13. In this case, the metal protrusion 60 may be provided only on the metal layer 54 that is positioned so as to oppose the circuit board 16 of the laminate substrate 10, which is applied with a higher voltage. In this manner, the electrical field intensity at the corner portion of the circuit board 16, which is applied with a higher voltage, can be reduced while saving the labor of manufacturing the metal protrusion 60.

Figure 4A:
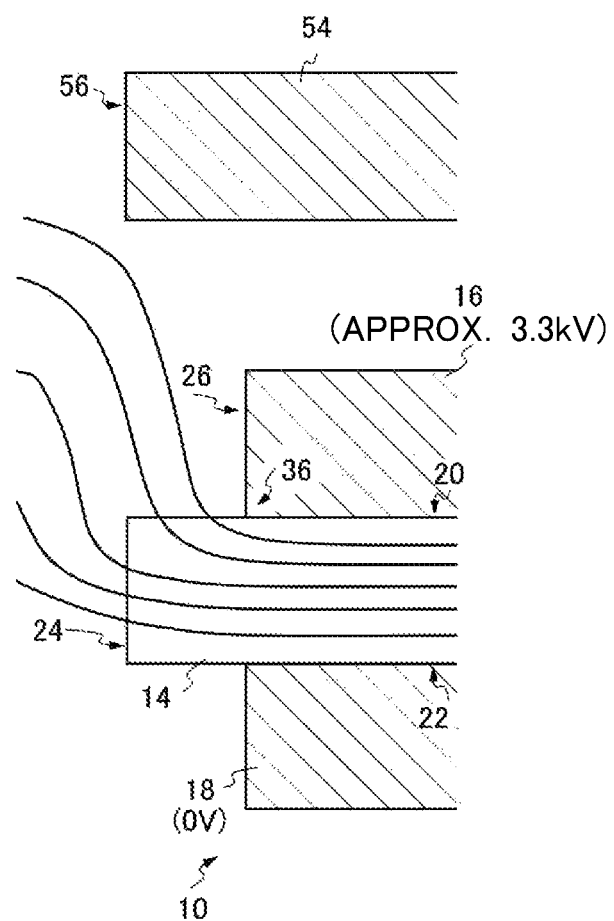
FIGS. 4A and 4B illustrate the principle of reducing the electrical field intensity in the second embodiment.
Figure 4B:
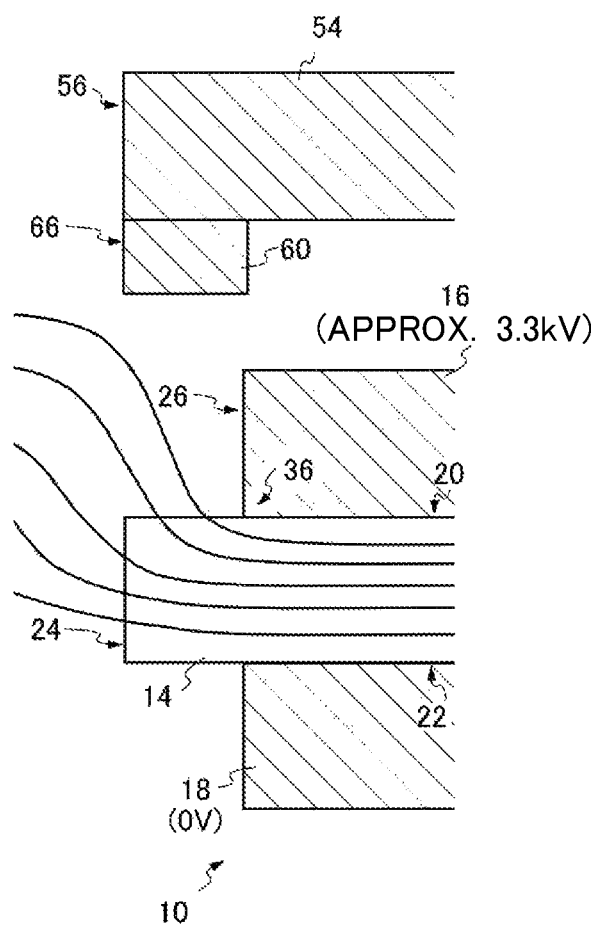

FIGS. 4A and 4B illustrate the principle of reducing the electrical field intensity in the second embodiment. FIGS. 4A and 4B are partially enlarged views of the outer edge portion 26 of the circuit board 16 of the laminate substrate 10 shown in FIG. 3.

FIG. 4A shows the equipotential lines in the vicinity of the outer edge portion 26 of the circuit board 16 in the first embodiment, where the metal protrusion 60 is not provided. FIG. 4B shows the equipotential lines in the vicinity of the outer edge portion 26 of the circuit board 16 in the second embodiment. As seen from FIG. 4B, the metal protrusion 60 is capable of positioning the equipotential lines more outside, when compared with the case shown in FIG. 4A. In this way, the electrical field intensity at the corner portion 36 of the outer edge portion 26 is further reduced. The electrical field intensity is reduced in a similar manner at the corner portion of the inner edge portion 27 of the circuit board 16.

Figure 5:
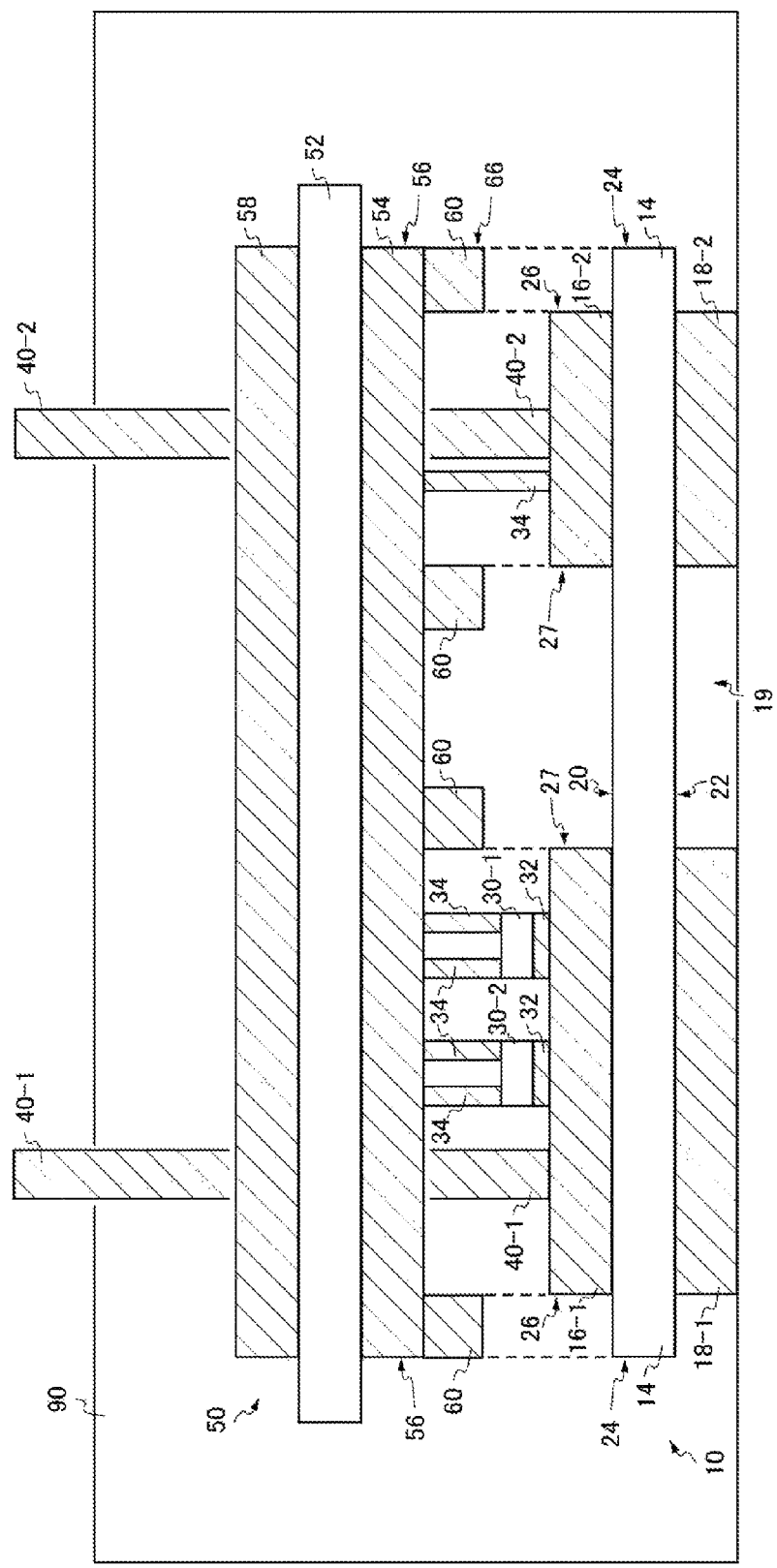
FIG. 5 is a schematic cross-sectional view of a semiconductor module 120 in a third embodiment.

FIG. 5 is a schematic cross-sectional view of a semiconductor module 120 in a third embodiment. The semiconductor module 120 of the present embodiment includes an insulative plate 14 that is shaped like a flat plate, and the insulative plate 14 is not divided, has no openings and provided as a single piece. In this respect, the third embodiment is different from the second embodiment. Except this, the third embodiment is the same as the second embodiment.

In the present embodiment, the laminate substrate 10 has a plurality of circuit boards 16-1 and 16-2 that are applied with different voltages in operation and separated from each other. The laminate substrate 10 has a plurality of metal plates 18-1 and 18-2 corresponding to the circuit boards 16-1 and 16-2. Stated differently, the metal plate 18 has an opening 19 formed therein in the region opposing the inner edge portions 27 of the circuit boards 16-1 and 16-2.

The third embodiment produces the same effects as the first and second embodiments. To be specific, the electrical field intensity at the outer edge portions 26 of the circuit boards 16-1 and 16-2 can be reduced. In addition, the electrical field intensity at the inner edge portions 27 of the circuit boards 16-1 and 16-2 can be also reduced.

Figure 6:
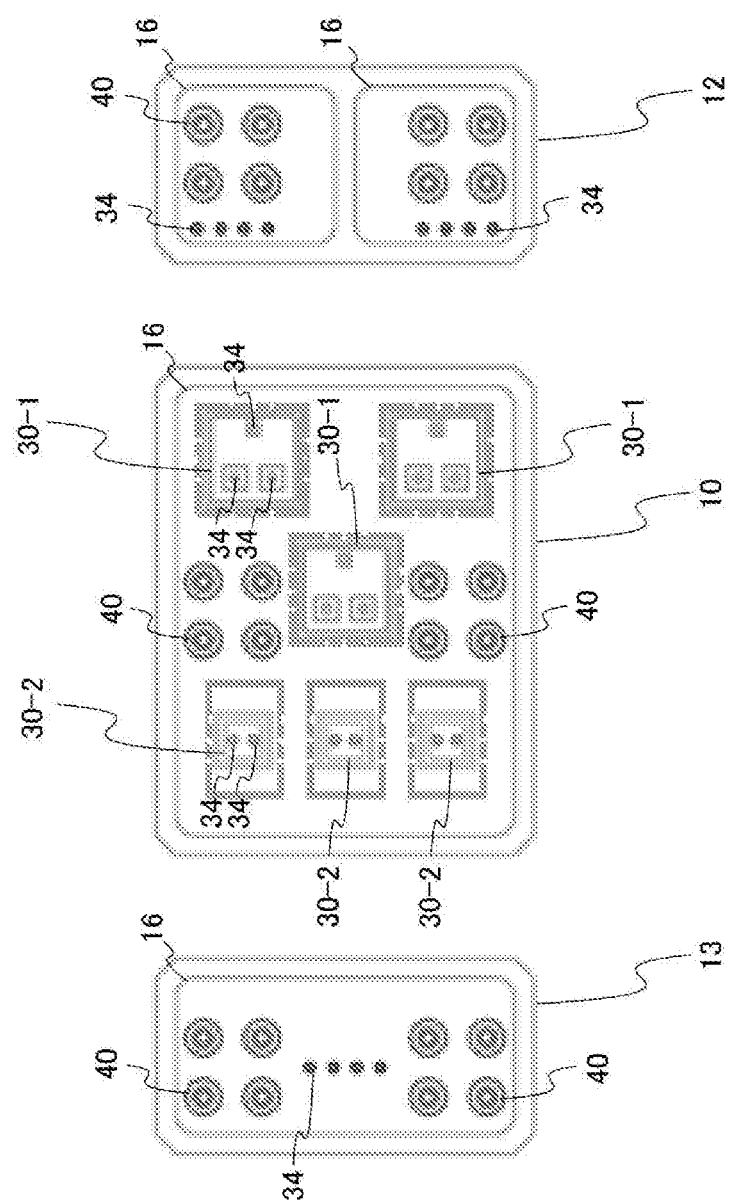
FIG. 6 is a top view showing a laminate substrate 10, a laminate substrate 12 and a laminate substrate 13.

FIG. 6 is a top view showing a laminate substrate 10, a laminate substrate 12 and a laminate substrate 13. The laminate substrates 10 and 13 correspond to the laminate substrates 10 and 13 relating to the first to third embodiments. In this embodiment, the laminate substrate 12 is added. The laminate substrate 12 has no semiconductor devices 30 placed thereon. In the present embodiment, the circuit board 16 of the laminate substrate 12 provides gate interconnections and auxiliary source interconnections.

In FIG. 6, similar symbols denote similar terminals, electrodes, devices or the like. Thus, the reference numbers are not assigned to all of the symbols in FIG. 6.

The semiconductor devices 30 provided on the laminate substrate 10 include a first semiconductor device 30-1 having switching capabilities and a second semiconductor device 30-2 having rectifying capabilities.

The external terminals 40 are indicated by the double circles. The electrically conductive posts 34 are designated by the smaller circles than the external terminals 40. The electrically conductive posts 34 are provided also on the first and second semiconductor devices 30-1 and 30-2.

Figure 7A:
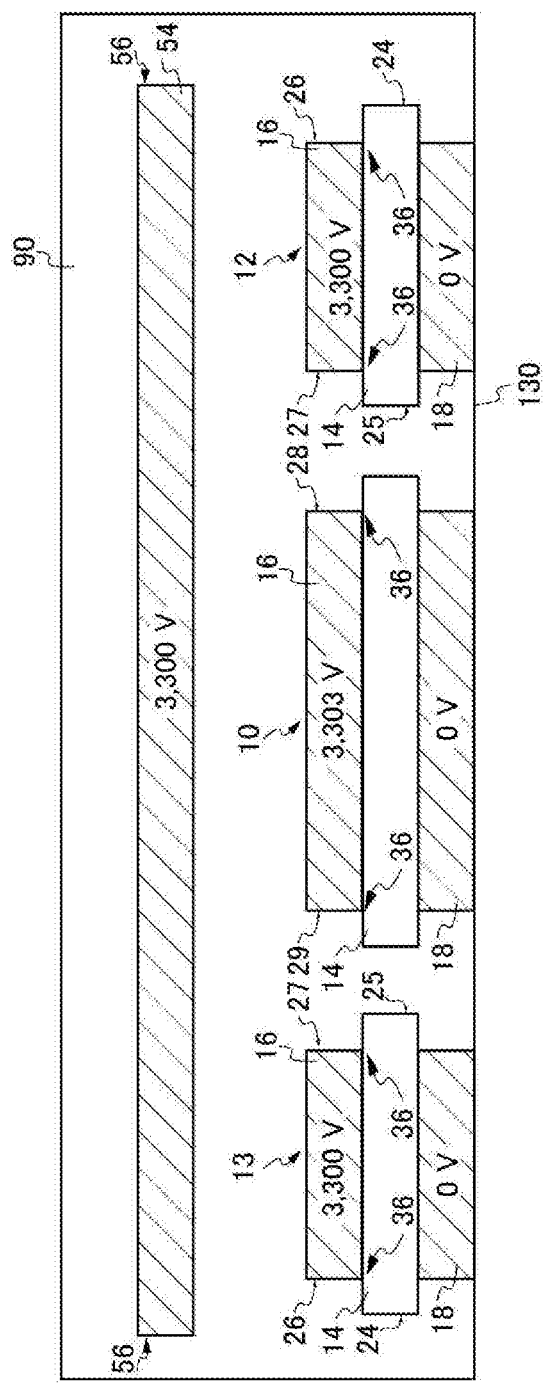
FIGS. 7A and 7B show a semiconductor module 130 in the current-supplied state and the OFF state.
Figure 7B:
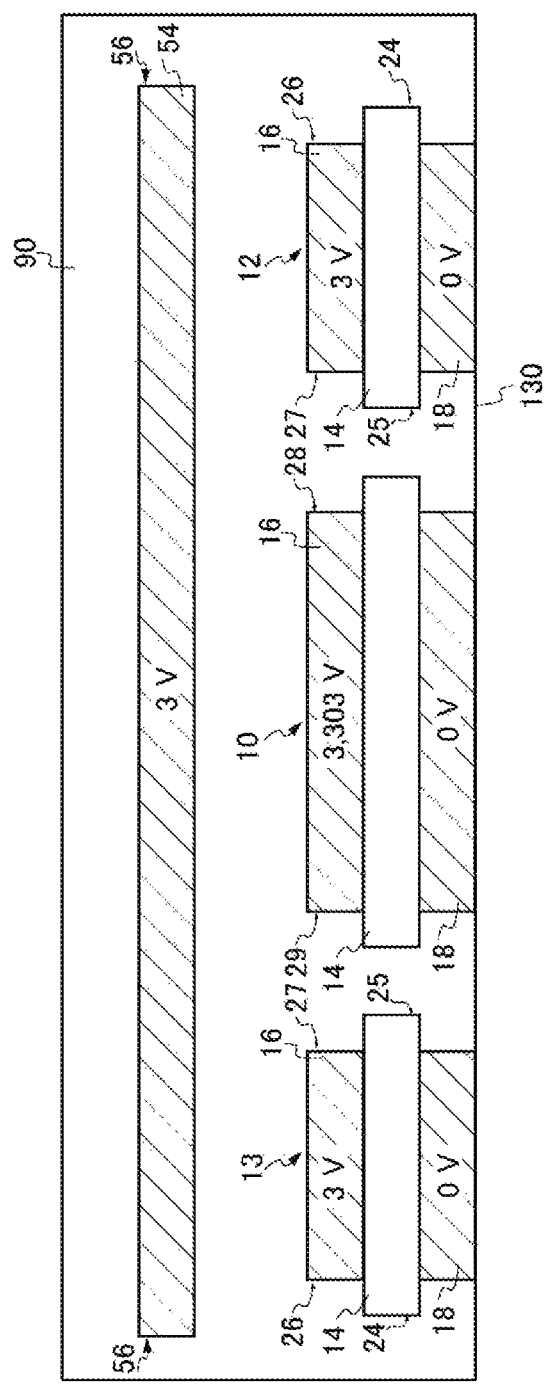

FIGS. 7A and 7B show a semiconductor module 130, which is provided as a model to simulate a distribution of potentials. The drawings after FIGS. 7A and 7B show distributions of potentials at the edge portions of the circuit boards 16 of the laminate substrates 10, 12 and 13. Note that the semiconductor devices 30, the electrically conductive posts 34, the external terminals 40, the base portion 52 and the metal layer 58 of the interconnecting substrate 50, and the like are not used in the simulations. In other words, the effects of these components are not taken into consideration in the simulations. It should be noted that the metal protrusion 60 is used in the simulations illustrated in the drawings through FIGS. 11A to 11C to FIG. 14.

As the laminate substrate 12 is added, one of the edge portions of the circuit board 16 of the laminate substrate 10 which is closer to the laminate substrate 12 is referred to as a first edge portion 28, and one of the edge portions of the circuit board 16 of the laminate substrate 10 which is closer to the laminate substrate 13 is referred to as a second edge portion 29.

FIG. 7A shows the semiconductor module 130 in the current-supplied state (the ON state). In the present embodiment, the circuit board 16 of the laminate substrate 13 provides the source interconnections, and the circuit board 16 of the laminate substrate 10 provides the drain interconnections. The circuit board 16 of the laminate substrate 12 provides the auxiliary source interconnections. The gate interconnections on the laminate substrate 12 are not shown or illustrated. When the semiconductor module 130 is in the ON state, a voltage of 3300 V is applied both to the source interconnections of the laminate substrate 13 and to the auxiliary source interconnections of the laminate substrate 12. In addition, a voltage of 3300 V is applied also to the metal layer 54 of the interconnecting substrate 50, which serves as the source interconnections. The drain interconnections of the laminate substrate 10 are applied with 3303 V. The metal plate 18 is grounded and thus applied with 0 V.

FIG. 7B shows the semiconductor module 130 in the no-current-supplied state (the OFF state). In the present embodiment, when the semiconductor module 130 is in the OFF state, the source interconnections of the laminate substrate 13 and the auxiliary source interconnections of the laminate substrate 12 are both applied with a voltage of 3 V. In addition, the metal layer 54 of the interconnecting substrate 50 is also applied with a voltage of 3 V. On the other hand, the drain interconnections of the laminate substrate 10 are applied with a voltage of 3303 V as is the case when the semiconductor module 130 is in the ON state. The metal plate 18 is still applied with 0 V when the semiconductor module 130 is in the OFF state.

For the simulations, the circuit board 16 and the metal plate 18 were both copper plates having a thickness of 1 mm. In addition, a copper foil having a thickness of 0.2 mm was used as the metal layer 54 of the interconnecting substrate 50. The insulative plate 14 of each laminate substrate was formed to have a thickness of 0.635 mm and made of aluminum nitride. An epoxy resin was used as the resin 90. The resin 90 was formed to have a thickness of 0.8 mm and to cover the respective components.

The insulative plate 14 of the laminate substrate 10 was separated away from the insulative plate 14 of the laminate substrate 12 by a distance of 3 mm. Likewise, the insulative plate 14 of the laminate substrate 10 was separated away from the insulative plate 14 of the laminate substrate 13 by a distance of 3 mm. The edge portion of the insulative plate 14 of each laminate substrate was positioned 1 mm outside the edge portion of the corresponding circuit board 16 and 1 mm outside the edge portion of the corresponding metal plate 18. The circuit board 16 of each of the laminate substrates was separated away from the metal layer 54 of the interconnecting substrate 50 by a distance of 1.55 mm.

Figures 8A, 8B:
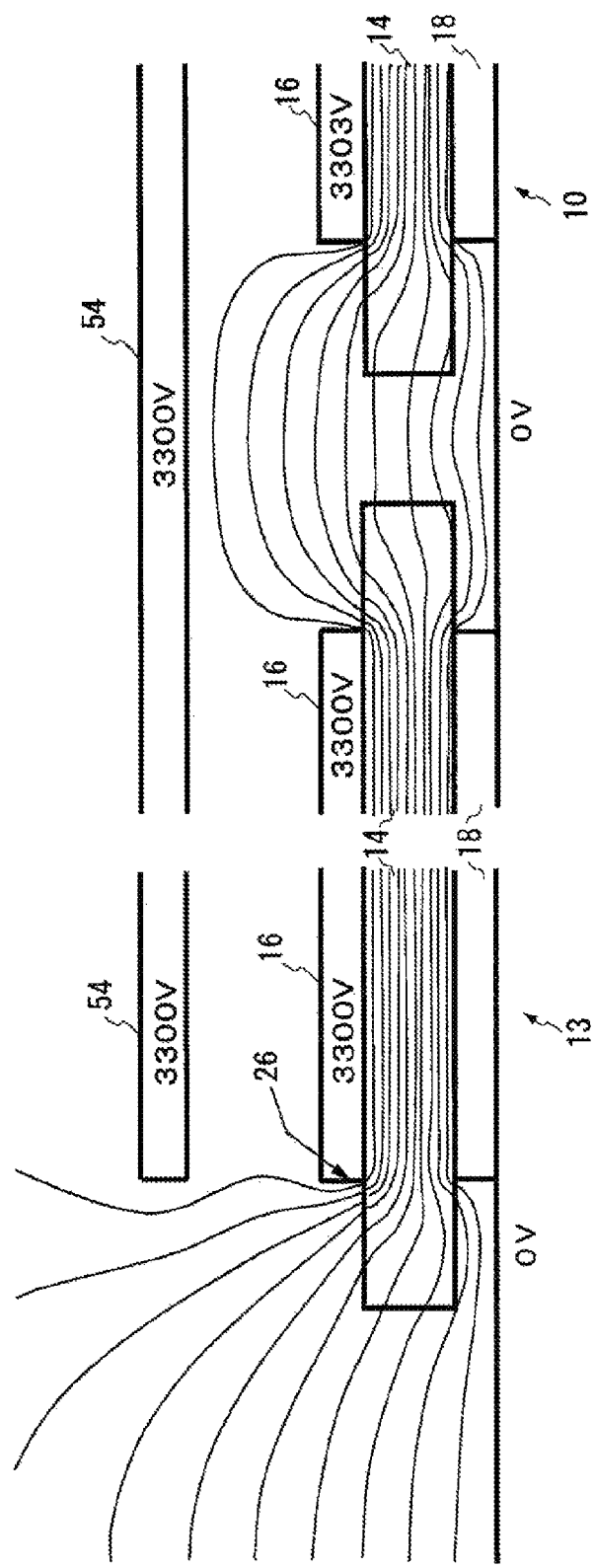
FIGS. 8A and 8B are enlarged views showing the semiconductor module 130 in the current-supplied state.

FIGS. 8A and 8B show distributions of potentials observed when the semiconductor module 130 is in the ON state. FIG. 8A is an enlarged view showing the vicinity of the outer edge portion 26 of the laminate substrate 13 shown in FIG. 7A. FIG. 8B is an enlarged view showing the space between the laminate substrate 13 and the laminate substrate 10 shown in FIG. 7A. Note that the equipotential lines within the insulative plate 14 are continued between FIG. 8A and FIG. 8B. FIGS. 8A and 8B do not show the laminate substrate 12.

In FIG. 8A, the metal layer 54 has an area overlapping the outer edge portion 26 of the circuit board 16. However, the metal layer 54 does not have an area that is positioned more outside than the outer edge portion 26 of the circuit board 16.

Figure 9A:
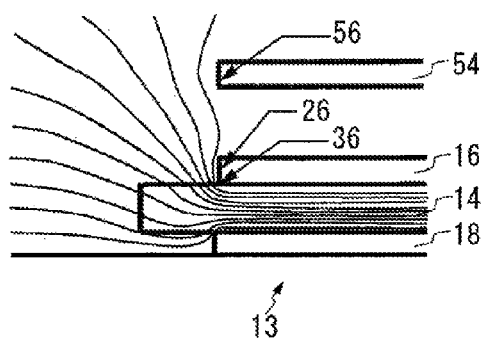
FIGS. 9A to 9D show the relation between the extended length of the outer edge portion of the metal layer 54 and the distribution of potentials.
Figure 9B:
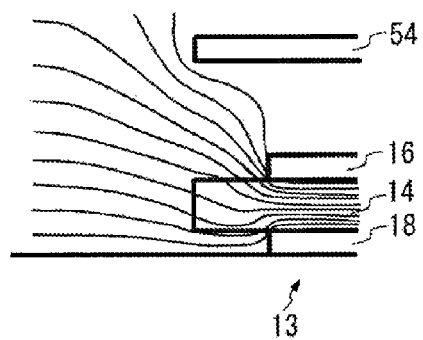
Figure 9C:
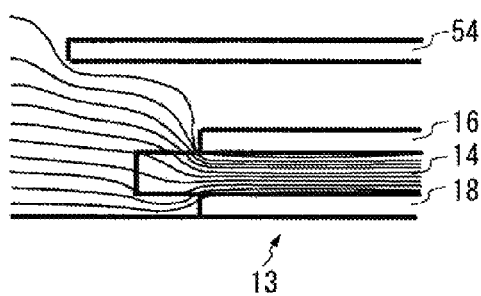
Figure 9D:
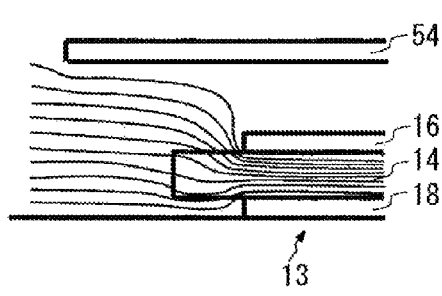

FIGS. 9A to 9D show the relation between the distribution of potentials and the length of the outward extension of the outer edge portion 56 of the metal layer 54 when seen in the direction perpendicular to the first surface 20 of the insulative plate 14. FIGS. 9A to 9D are enlarged views showing the distributions of the potentials observed in the vicinity of the edge portion of the laminate substrate 13 when the semiconductor module 130 is in the ON state. Here, the length of the outward extension of the outer edge portion 56 of the metal layer 54, when compared with the outer edge portion 26 of the circuit board 16, was varied. The length of the outward extension was set to 0 mm for the case shown in FIG. 9A, 1 mm FIG. 9B, 2 mm FIG. 9C, and 2.3 mm FIG. 9D. Note that the case shown in FIG. 9A is equivalent to the case shown in FIG. 8B.

FIGS. 9A to 9D clearly indicate that, as the outward extension of the outer edge portion 56 of the metal layer 54 when compared with the outer edge portion 26 of the circuit board 16 increases, the equipotential lines are driven more outward. In this manner, the electrical field intensity at the corner portion 36 of the outer edge portion 26 of the circuit board 16 is reduced.

Figure 10:
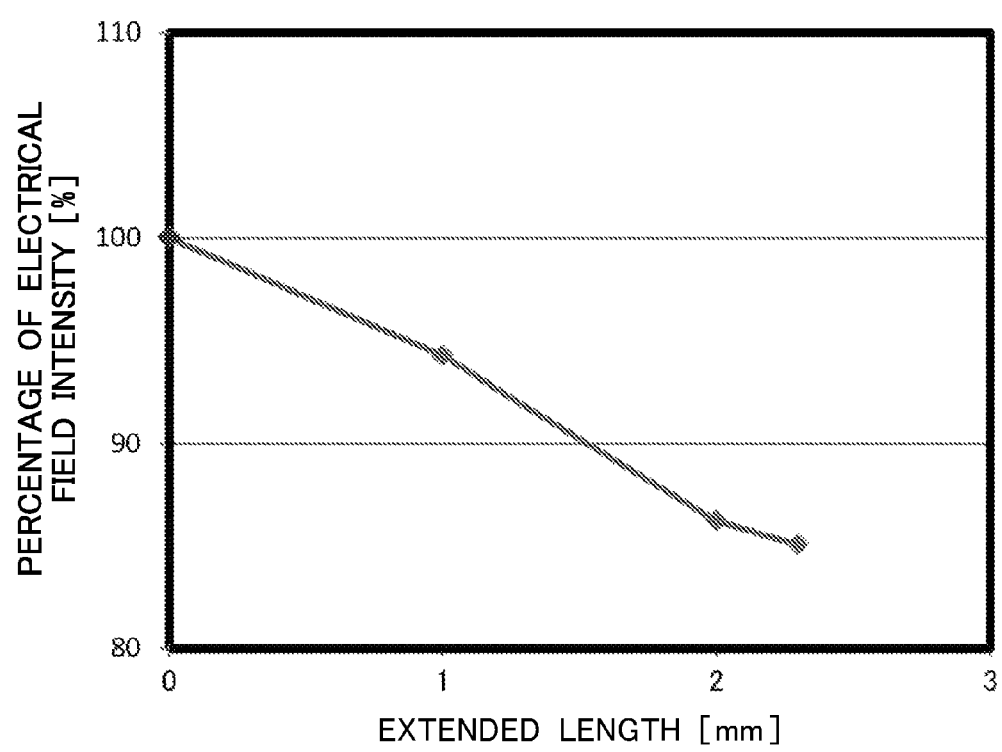
FIG. 10 is a graph showing the relation between the extended length of the the outer edge portion and the percentage of the electrical field intensity at the corner portion.

FIG. 10 is a graph showing the relation between the length of the extension of the outer edge portion 56 of the metal layer 54 and the percentage of the electrical field intensity at the corner portion 36. FIG. 10 quantitatively presents the results shown in FIGS. 9A to 9D. The case where the length of the extension is 0 mm is equivalent to the case shown in FIG. 9A. The percentage of the electrical field intensity is determined as compared to the electrical field intensity observed when the length of the extension is 0 mm, which is taken as 100%.

When the length of the extension was 1 mm, the electrical field intensity at the corner portion 36 was equal to 94.25% of the electrical field intensity observed when the length of the extension was 0 mm. When the length of the extension was 2 mm, the electrical field intensity at the corner portion 36 was equal to 86.21% of the electrical field intensity observed when the length of the extension was 0 mm. When the length of the extension was 2.3 mm, the electrical field intensity at the corner portion 36 was equal to 85.06% of the electrical field intensity observed when the length of the extension was 0 mm. These results evidently indicate that the electrical field intensity at the corner portion 36 was reduced by allowing the outer edge portion 56 of the metal layer 54 to be positioned more outside than the outer edge portion 26 of the circuit board 16. Here, it should be noted that the interconnecting substrate 50 is significantly larger than the laminate substrate 13 when the length of the extension of the metal layer 54 is 2 mm or more. Therefore, the influence of the interconnecting substrate 50 on the size of the semiconductor module 100 is too significant to ignore. Thus, it is particularly preferred to set the length of the extension of the metal layer 54 to 2 mm or less since it is avoided that the semiconductor module 100 becomes unnecessarily large.

Figure 11A:
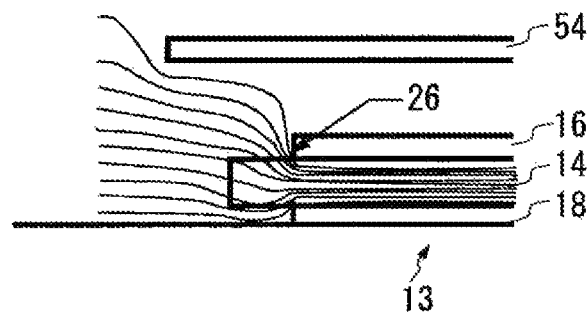
FIGS. 11A to 11C show the relation between the protruding length of the metal protrusion 60 and the distribution of the potentials at the outer edge portion.
Figure 11B:
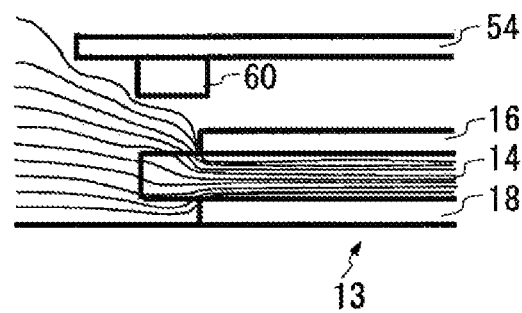
Figure 11C:
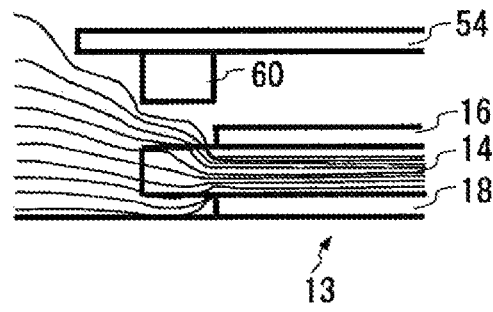

FIGS. 11A to 11C show the relation between the protruding length of the metal protrusion 60 and the distributions of the potentials at the outer edge portion 26. FIGS. 11A to 11C are enlarged views showing the distributions of the potentials observed in the vicinity of the edge portion of the laminate substrate 13 when the semiconductor module 130 is in the ON state. The metal layer 54 outwardly extends by 2 mm when compared with the outer edge portion 26 of the circuit board 16. FIG. 11A shows the results observed when the metal protrusion 60 is not provided. FIG. 11B shows the results observed when the metal protrusion 60 protrudes by 0.5 mm in the direction towards the laminate substrate 13. FIG. 11C shows the results observed when the metal protrusion 60 protrudes by 0.7 mm in the direction towards the laminate substrate 13. The case shown in FIG. 11A is equivalent to the case shown in FIG. 9C.

Figure 12:
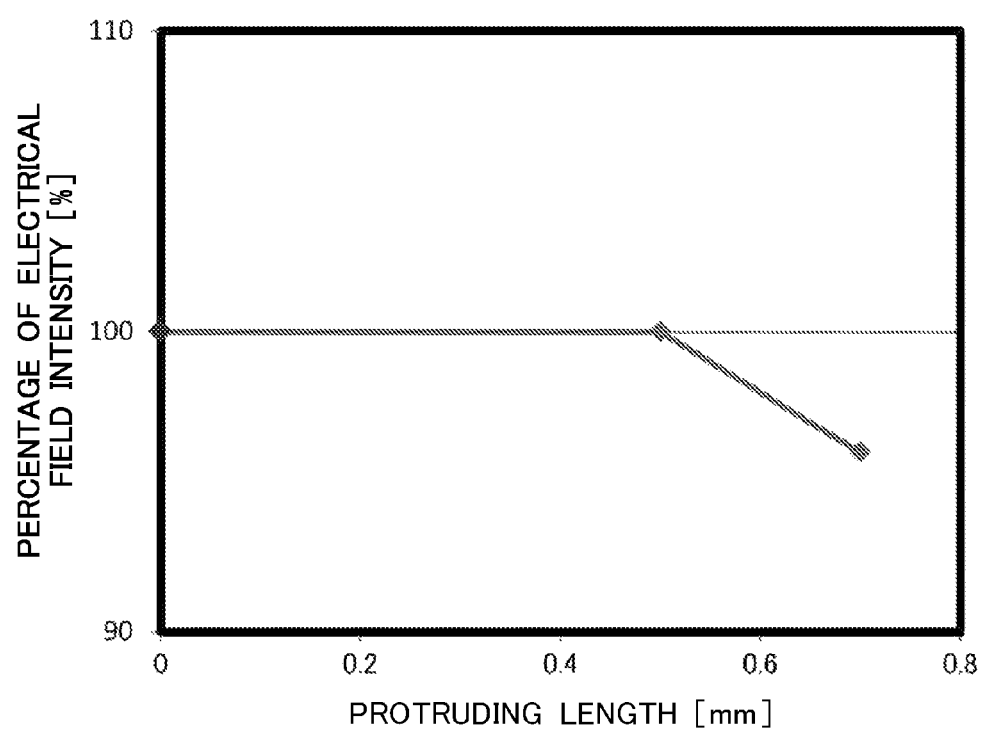
FIG. 12 is a graph showing the relation between the protruding length of the metal protrusion 60 and the percentage of the electrical field intensity at the corner portion of the outer edge portion.

FIG. 12 is a graph showing the relation between the protruding length of the metal protrusion 60 and the percentage of the electrical field intensity at the corner portion 36 of the outer edge portion 26. FIG. 12 quantitatively shows the results shown in FIGS. 11A to 11C. The case where the protruding length of the metal protrusion 60 is 0 mm is equivalent to the case shown in FIG. 11A. The percentage of the electrical field intensity is determined as compared to the electrical field intensity observed when the protruding length is 0 mm, which is taken as 100%.

When the protruding length was 0.5 mm, the electrical field intensity at the corner portion 36 was substantially equal to the electrical field intensity observed when the protruding length is 0 mm (=100%). However, when the protruding length was 0.7 mm, the electrical field intensity at the corner portion 36 was 96% of the electrical field intensity observed when the protruding length was 0 mm. This has demonstrated such effects that, as the protruding length of the metal protrusion 60 increases, the electrical field intensity at the corner portion 36 of the outer edge portion 26 is reduced. The electrical field intensity at the corner portion 36 can be effectively reduced when the protruding length of the metal protrusion 60 is 0.5 mm or more.

Figure 13:
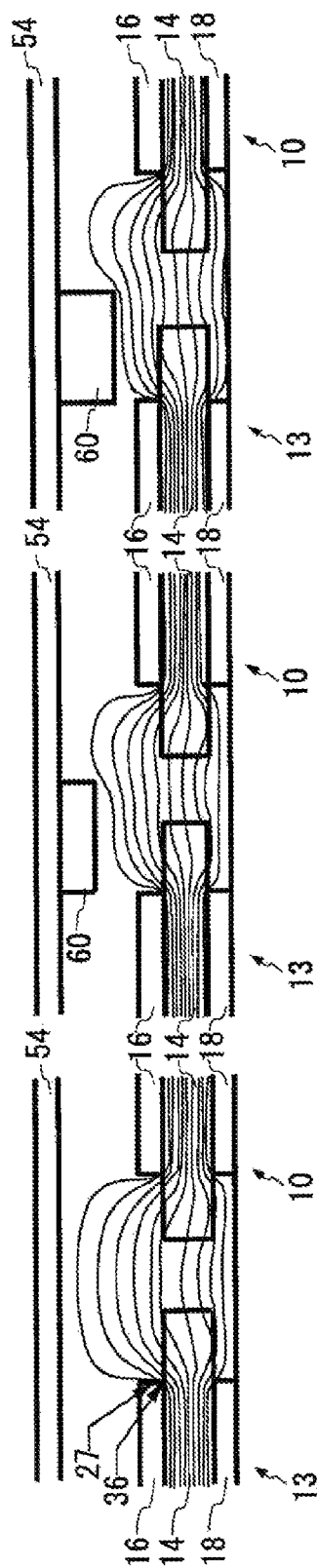
FIGS. 13A to 13C show the relation between the protruding length of the metal protrusion 60 and the distribution of the potentials at the inner edge portion.

FIGS. 13A to 13C show the relation between the protruding length of the metal protrusion 60 and the distributions of the potentials at the inner edge portion 27 of the circuit board 16 of the laminate substrate 13. FIGS. 13A to 13C are enlarged views showing the distributions of the potentials in the vicinity of the region between the second edge portion 29 of the laminate substrate 10 and the inner edge portion 27 of the laminate substrate 13. Note that FIGS. 13A to 13C show the results observed when the semiconductor module 130 is in the ON state. FIG. 13A shows the results observed when the metal protrusion 60 is not provided. FIG. 13B shows the results observed when the metal protrusion 60 protrude by 0.5 mm from the metal layer 54 towards the laminate substrate 13 between the laminate substrate 13 and the laminate substrate 10. FIG. 13C shows the results observed when the metal protrusion 60 protrudes by 0.7 mm in the direction towards the laminate substrate 13.

Figure 14:
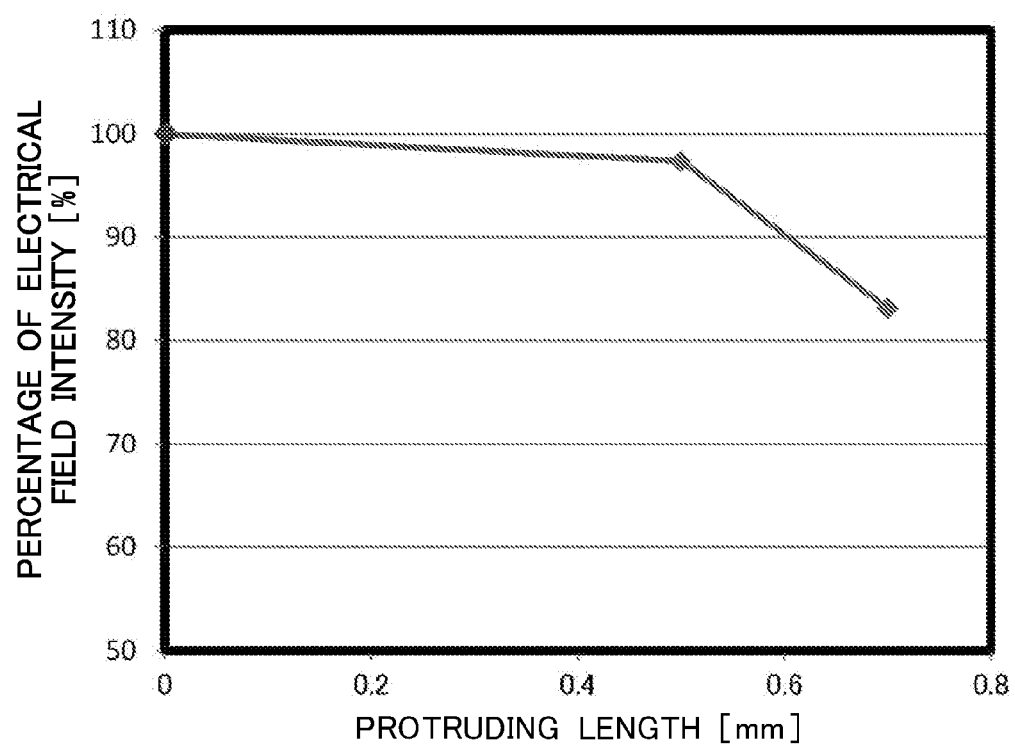
FIG. 14 is a graph showing the relation between the protruding length of the metal protrusion 60 and the percentage of the electrical field intensity at the corner portion of the inner edge portion.

FIG. 14 is a graph showing the relation between the protruding length of the metal protrusion 60 and the percentage of the electrical field intensity at the corner portion 36 of the inner edge portion 27 of the circuit board 16 of the laminate substrate 13. FIG. 14 quantitatively shows the results shown in FIGS. 13A to 13C. The percentage of the electrical field intensity is determined as compared to the electrical field intensity observed when the protruding length is 0 mm, which is shown in FIG. 13A and taken as 100%.

When the protruding length was 0.5 mm, the electrical field intensity at the corner portion 36 was equal to 97.40% of the electrical field intensity observed when the protruding length was 0 mm. When the protruding length was 0.7 mm, the electrical field intensity at the corner portion 36 was equal to 83.12% of the electrical field intensity observed when the protruding length was 0 mm. These results have demonstrated that, as the protruding length of the metal protrusion 60 increases, the electrical field intensity at the corner portion 36 of the inner edge portion 27 is also effectively reduced.

Figure 15A:
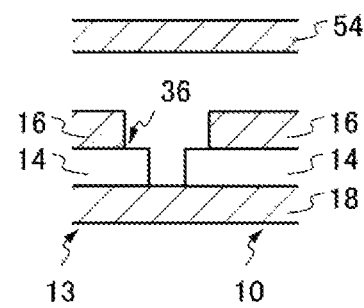
FIGS. 15A to 15C show the percentage of the electrical field intensity at the corner portion measured for a case where a metal plate 18 is not divided and for a case where the metal plate 18 is divided.
Figure 15B:
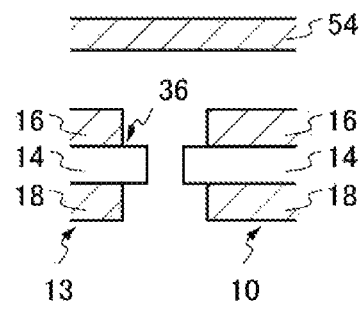
Figure 15C:
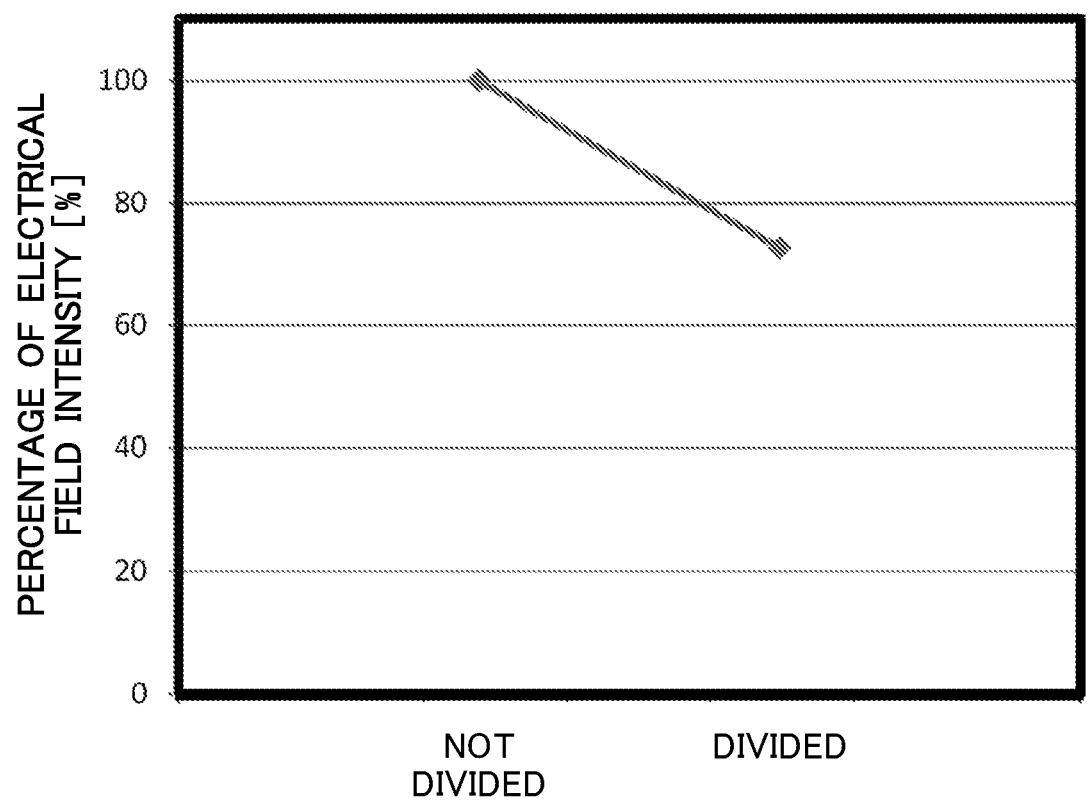

FIG. 15A shows a case where the metal plate 18 is not divided and FIG. 15B shows a case where the metal plate 18 is divided. FIG. 15C shows the percentage of the electrical field intensity at the corner portion 36, which is observed when the metal plate 18 is not divided and when the metal plate 18 is divided. The percentage of the electrical field intensity at the corner portion 36 of the inner edge portion 27 of the circuit board 16 of the laminate substrate 13 is determined as compared to the electrical field intensity observed in the case shown in FIG. 15A, which is taken as 100%. The percentage of the electrical field intensity at the corner portion 36 observed in the case shown in FIG. 15B was 72.64%.

In the case shown in FIG. 15A, the equipotential lines cannot penetrate through the metal plate 18. In the case shown in FIG. 15B, on the other hand, the equipotential lines can be driven through the region between the divided regions of the metal plate 18. As the equipotential lines protrude through the regions between the divided regions of the metal plate 18, the equipotential lines are less densely arranged at the corner portion 36. This can resultantly reduce the electrical field intensity at the corner portion 36.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

DESCRIPTION OF REFERENCE NUMERALS

10 . . . laminate substrate, 12 . . . laminate substrate, 13 . . . laminate substrate, 14 . . . insulative plate, 16 . . . circuit board, 18 . . . metal plate, 19 . . . opening, 20 . . . first surface, 22 . . . second surface, 24 . . . outer edge portion, 25 . . . inner edge portion, 26 . . . outer edge portion, 27 . . . inner edge portion, 28 . . . first edge portion, 29 . . . second edge portion, 30 . . . semiconductor device, 32 . . . electrical conductive adhesive layer, 34 . . . electrically conductive post, 36 . . . corner portion, 40 . . . external terminal, 50 . . . interconnecting substrate, 52 . . . base portion, 54 . . . metal layer, 56 . . . outer edge portion, 58 . . . metal layer, 60 . . . metal protrusion, 66 . . . outer edge portion, 90 . . . resin, 100 . . . semiconductor module, 110 . . . semiconductor module, 120 . . . semiconductor module, 130 . . . semiconductor module

What is claimed is:

1. A semiconductor module comprising:
   a laminate substrate including an insulative plate, a circuit board provided on a first surface of the insulative plate and a metal plate provided on a second surface that is opposite to the first surface; and
   an interconnecting substrate that opposes the laminate substrate, the interconnecting substrate including a metal layer, wherein
   the insulative plate extends more outside than an outer edge portion of the circuit board, and
   the metal layer has a region overlapping the outer edge portion of the circuit board and extends more outside than the outer edge portion of the circuit board.

2. The semiconductor module as set forth in claim 1, wherein
   a length of outward extension of the metal layer when compared with the outer edge portion of the circuit board is 2 mm or less.

3. The semiconductor module as set forth in claim 1, wherein
   the interconnecting substrate further includes one or more metal protrusions that protrude from the metal layer toward the laminate substrate, and
   the metal protrusions include a metal protrusion at least a portion of which is positioned more outside than the outer edge portion of the circuit board.

4. The semiconductor module as set forth in claim 3, wherein
   the metal protrusion has a region overlapping the outer edge portion of the circuit board.

5. The semiconductor module as set forth in claim 3, wherein
   the semiconductor module includes a plurality of the circuit boards that are separated away from each other, and
   the metal protrusions include a metal protrusion at least a portion of which is positioned more inside than inner edge portions of the circuit boards.

6. The semiconductor module as set forth in claim 3, wherein
   the semiconductor module includes a plurality of the circuit boards that are separated away from each other and that are respectively applied with different voltages, and
   the metal protrusion is positioned on the metal layer so as to oppose one of the circuit boards that is applied with a higher voltage.

7. The semiconductor module as set forth in claim 1, wherein
   the semiconductor module includes a plurality of the circuit boards that are separated away from each other and that are respectively applied with different voltages, and
   the metal plate has an opening formed therein in a region opposing inner edge portions of the respective circuit boards.

8. The semiconductor module as set forth in claim 7, wherein
   a plurality of the metal plates are provided so as to correspond to the plurality of circuit boards.

9. The semiconductor module as set forth in claim 7, wherein
the insulative plate is formed like a flat plate, and is provided as a single piece and is not divided or has no openings.

* * * * *